United States Patent
Kim et al.

(10) Patent No.: US 11,728,230 B2
(45) Date of Patent: Aug. 15, 2023

(54) SEMICONDUCTOR PACKAGE AND METHOD OF FABRICATING THE SAME

(71) Applicant: SAMSUNG ELECTRONICS CO., LTD., Suwon-si (KR)

(72) Inventors: Ji Hwang Kim, Cheonan-si (KR); Dongho Kim, Hwaseong-si (KR); Jin-Woo Park, Seoul (KR); Jongbo Shim, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 126 days.

(21) Appl. No.: 17/350,329

(22) Filed: Jun. 17, 2021

(65) Prior Publication Data
US 2022/0115281 A1  Apr. 14, 2022

(30) Foreign Application Priority Data
Oct. 12, 2020 (KR) .................... 10-2020-0131425

(51) Int. Cl.
*H01L 23/13*  (2006.01)
*H01L 25/10*  (2006.01)
*H01L 25/00*  (2006.01)
*H01L 21/48*  (2006.01)

(52) U.S. Cl.
CPC .......... *H01L 23/13* (2013.01); *H01L 21/4853* (2013.01); *H01L 25/105* (2013.01); *H01L 25/50* (2013.01); *H01L 2225/1023* (2013.01); *H01L 2225/1058* (2013.01)

(58) Field of Classification Search
CPC ................. H01L 23/13; H01L 21/4853; H01L 2225/1023; H01L 2225/1058; H01L 24/08; H01L 24/06; H01L 24/09; H01L 2924/181; H01L 25/105
See application file for complete search history.

(56) References Cited

U.S. PATENT DOCUMENTS

| | | | |
|---|---|---|---|
| 7,425,468 B2 | 9/2008 | Wang et al. |
| 7,846,829 B2 | 12/2010 | Tanaka et al. |
| 9,040,838 B2 | 5/2015 | Lee et al. |
| 9,245,867 B2 | 1/2016 | Yim et al. |

(Continued)

*Primary Examiner* — Thanh Y. Tran
(74) *Attorney, Agent, or Firm* — F. Chau & Associates, LLC

(57) ABSTRACT

A semiconductor package includes: a lower package: an upper substrate on the lower package: and connection members connecting the lower package to the upper substrate, wherein the lower package includes: a lower substrate; and a lower semiconductor chip, wherein the upper substrate includes: an upper substrate body: upper connection pads combined with the connection members: and auxiliary members extending from the upper substrate body toward the lower substrate, wherein the connection members are arranged in a first horizontal direction to form a first connection member column, wherein the auxiliary members are arranged in the first horizontal direction to form a first auxiliary member column, wherein the first connection member column and the first auxiliary member column are located between a side surface of the lower semiconductor chip and a side surface of the lower substrate, and the first auxiliary member column is spaced apart from the first connection member column.

20 Claims, 19 Drawing Sheets

(56) References Cited

U.S. PATENT DOCUMENTS

| | | |
|---|---|---|
| 9,324,657 B2 | 4/2016 | Seo et al. |
| 10,231,338 B2 | 3/2019 | Yagnamurthy et al. |
| 10,475,749 B2 | 11/2019 | Kim |
| 10,510,684 B2 | 12/2019 | Wu et al. |
| 10,622,340 B2 | 4/2020 | Jeong et al. |
| 2015/0380340 A1 | 12/2015 | Cheng et al. |
| 2017/0317054 A1 | 11/2017 | Tsao et al. |
| 2019/0103364 A1* | 4/2019 | Kim .................... H01L 25/0657 |
| 2020/0118984 A1 | 4/2020 | Chen et al. |

* cited by examiner

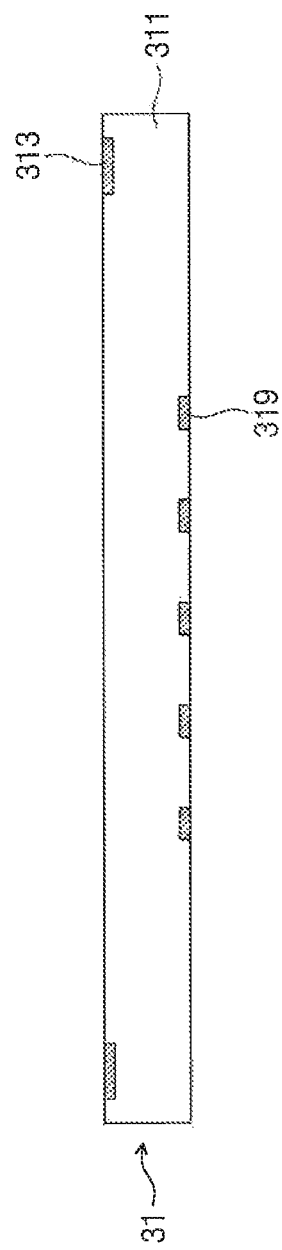
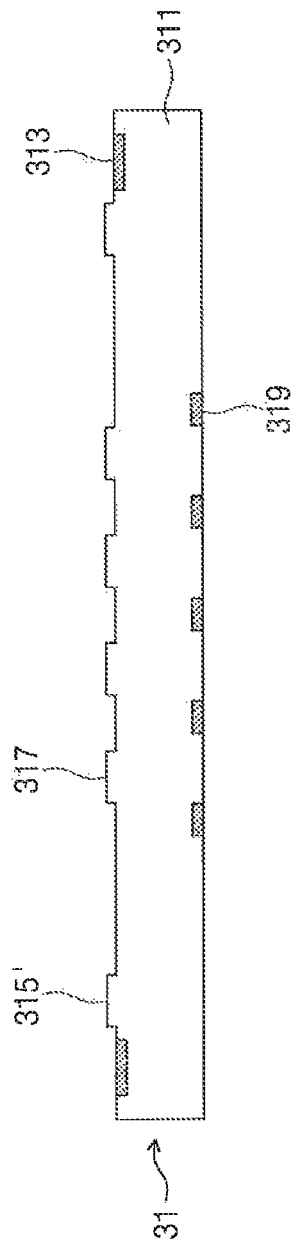

US 11,728,230 B2

SEMICONDUCTOR PACKAGE AND METHOD OF FABRICATING THE SAME

CROSS-REFERENCE TO RELATED APPLICATION

This U.S. non-provisional patent application claims priority under 35 U.S.C. § 119 to Korean Patent Application No. 10-2020-0131425, filed on Oct. 12, 2020, in the Korean Intellectual Property Office, the disclosure of which is incorporated by reference herein in its entirety.

TECHNICAL FIELD

The present inventive concept relates to a semiconductor package and a method of fabricating the same.

DISCUSSION OF THE RELATED ART

A semiconductor package may be configured to use a semiconductor chip as a part of an electronic product. In general, the semiconductor package includes a substrate, such as a printed circuit board (PCB), and a semiconductor chip mounted thereon. A plurality of semiconductor chips may be mounted in each semiconductor package. Each of the semiconductor chips may be configured to perform various functions. The semiconductor chips may be stacked on a single substrate. Typically, a package-on-package (POP) structure, in which a semiconductor package is placed on another semiconductor package, is used. Various structures have been under development to electrically connect vertically-stacked semiconductor packages to each other.

SUMMARY

According to an exemplary embodiment of the present inventive concept, a semiconductor package includes: a lower package; an upper substrate on the lower package; and a plurality of connection members electrically connecting the lower package to the upper substrate, wherein the lower package includes: a lower substrate; and a lower semiconductor chip on the lower substrate, wherein the upper substrate includes: an upper substrate body; upper connection pads provided on the upper substrate body and combined with the plurality of connection members, respectively; and a auxiliary members extending from a bottom surface of the upper substrate body toward the lower substrate, wherein the auxiliary members include the same insulating material as the upper substrate body, wherein the plurality of connection members are arranged in a first horizontal direction to form a first connection member column, wherein the auxiliary members are arranged in the first horizontal direction to form a first auxiliary member column, wherein the first connection member column and the first auxiliary member column are located between a side surface of the lower semiconductor chip and a side surface of the lower substrate, and the first auxiliary member column is spaced apart from the first connection member column, in a second horizontal direction crossing the first horizontal direction.

According to an exemplary embodiment of the present inventive concept, a semiconductor package includes: a lower package; an upper package on the lower package; and a plurality of connection members electrically connecting the lower package to the upper package, wherein the lower package includes: a lower substrate; and a lower semiconductor chip on the lower substrate, wherein the upper package includes: an upper substrate; and an upper semiconductor chip on the upper substrate, wherein the upper substrate includes: an upper substrate body; upper connection pads exposed by a bottom surface of the upper substrate body and are respectively combined with the plurality of connection members; and auxiliary members extending from the bottom surface of the upper substrate body in a first direction, wherein the lower substrate includes: a lower substrate body; and lower connection pads exposed by a top surface of the lower substrate body and are respectively combined with the plurality of connection members, wherein the plurality of connection members are arranged to form: a first connection member column parallel to a second direction crossing the first direction; a first connection member row parallel to a third direction crossing the first direction and the second direction; and a second connection member row parallel to the third direction, wherein the first connection member row and the second connection member row are spaced apart from each other in the second direction, wherein the auxiliary members are arranged in the second direction to form a first auxiliary member column spaced apart from the lower semiconductor chip in the third direction, and wherein the first auxiliary member column is spaced apart from the first connection member column in the third direction.

According to an exemplary embodiment of the present inventive concept, a method of fabricating a semiconductor package includes: preparing a lower structure; preparing an upper structure; and combining the upper structure to the lower structure, wherein the upper structure includes a substrate, wherein the substrate includes: a substrate body; a connection pad on a bottom surface of the substrate body; and an auxiliary member extending from the bottom surface of the substrate body, wherein the combining of the upper structure to the lower structure includes: combining an upper solder ball to the connection pad on the bottom surface of the substrate body; coating the upper solder ball with a flux; and combining the upper structure, on which the upper solder ball coated with the flux is provided, with the lower structure, wherein the upper solder ball and the auxiliary member are spaced apart from each other, and wherein the coating of the upper solder ball with the flux includes forming the flux in a region between the upper solder ball and the auxiliary member.

BRIEF DESCRIPTION OF THE DRAWINGS

FIGS. 6, 7, 8, 9, 10, 11, 12, 13, 14, 15, 16, 17, 18 and 19 are cross-sectional views sequentially illustrating a process of fabricating a semiconductor package using the method of FIG. 5.

DETAILED DESCRIPTION OF THE EMBODIMENTS

Exemplary embodiments of the present inventive concept will now be described more fully with reference to the accompanying drawings.

Figure 1:
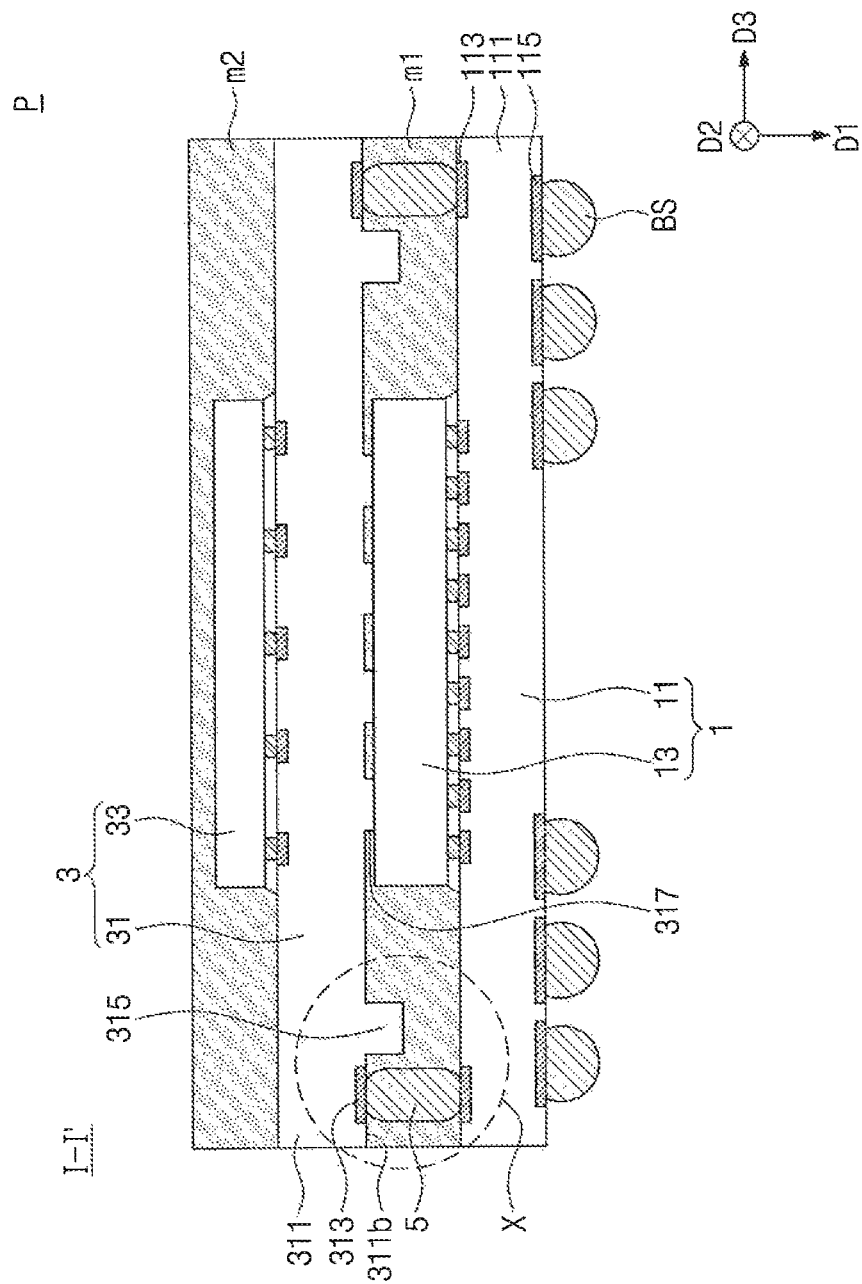
FIG. 1 is a cross-sectional view illustrating a semiconductor package according to an exemplary embodiment of the present inventive concept.

FIG. 1 is a cross-sectional view illustrating a semiconductor package according to an exemplary embodiment of the present in inventive concept.

Hereinafter, the reference numbers "D1" and "D2" of FIG. 1 will be used to indicate first and second directions, respectively, and the reference number "D3", which is depicted as crossing the first and second directions D1 and D2, will be used to indicate a third direction.

Referring to FIG. 1, a semiconductor package P may be provided in an exemplary embodiment of the present inventive concept, the semiconductor package P may have a package-on-package (POP) structure. However, the present inventive concept is not limited to this example, and in an exemplary embodiment of the present inventive concept, the semiconductor package P may have a on-POP structure. For the sake of brevity, the description that follows will refer to an example in which the semiconductor package P has the POP structure.

The semiconductor package P may include a lower package 1, an upper package 3, and a connection member 5. In an exemplary embodiment of the present inventive concept, the semiconductor package P may further include a lower mold layer m1, an upper mold layer m2, and an outer connection ball BS.

The lower package 1 may include a lower substrate 11 and a lower semiconductor chip 13. For example, the lower substrate 11 may include a printed circuit board (PCB), a redistribution layer substrate, or the like. The lower substrate 11 may be configured to electrically connect the lower semiconductor chip 13, the upper package 3, and/or an external element to each other. The lower substrate 11 may include a lower substrate body 111, a lower connection pad 113, and an outer connection pad 115. The lower substrate body 111 may provide an outer appearance of the lower substrate 11. The lower substrate body 111 may be formed of or include at least one of insulating materials. For example, the lower substrate body 111 may include a photo solder resist (PSR) or the like. A wiring structure, which is formed off a conductive material, may be provided in the lower substrate body 111. The lower connection pad 113 may be provided on the lower substrate body 111. For example, the lower connection pad 113 may be provided on a top surface of the lower substrate body 111. For example, the lower connection pad 113 may be exposed by the top surface of the lower substrate body 111. The lower connection pad 113 may be combined with the connection member 5. The lower connection pad 113 may be electrically connected to the upper package 3 through the connection member 5. In an exemplary embodiment of the present inventive concept, a plurality of the lower connection pads 113 may be provided. The lower connection pads 113 may be spaced apart from each other in the second direction D2 and/or the third direction D3. However, in the following description, the lower connection pad 113 will be referred to as the singular element, for the sake of brevity.

The upper package 3 may be located on the lower package 1. The upper package 3 may be placed on and combined with the lower package 1. The upper package 3 may include an upper substrate 31 and an upper semiconductor chip 33. For example, the upper substrate 31 may include a printed circuit board (PCB), a redistribution layer substrate, or the like. The upper substrate 31 may be configured to electrically connect the upper semiconductor chip 33 and the lower package 1 to each other. The upper substrate 31 may include an upper substrate body 311, an upper connection pad 313, an auxiliary member 315, and a spacer 317. The upper substrate body 311 may provide an outer appearance of the upper substrate 31. The upper substrate body 311 may be formed of or include at least one of insulating materials. For example, the upper substrate body 311 may include a photo solder resist (PSR) or the like. A wiring structure, which is formed of a conductive material, may be provided in the upper substrate body 311. The upper connection pad 313 may be provided on the upper substrate body 311. For example, the upper connection pad 313 may be provide on a bottom surface 311b of the upper substrate body 311. For example, the upper connection pad 313 may be exposed by the bottom surface 311b of the upper substrate body 311. The upper connection pad 313 may be combined with the connection member 5. The upper connection pad 313 may be electrically connected to the lower package 1 through the connection member 5. In an exemplary embodiment of the present inventive concept, a plurality of the upper connection pads 313 may be provided in the upper substrate 31. The upper connection pads 313 may be spaced apart from each other in the second direction D2 and/or the third direction D3. However, in the following description, the upper connection pad 313 will be referred to as the singular element, for the sake of brevity.

The auxiliary member 315 may be extended from the bottom surface 311b of the upper substrate body 311 by a predetermined length in a downward direction. For example, the auxiliary member 315 may be a protrusion from the bottom surface 311b of the upper substrate body 311. For example, the auxiliary member 315 may be extended from the bottom surface 311b of the upper substrate body 311 in the first direction D1. The auxiliary member 315 may be formed of or include various materials. For example, the auxiliary member 315 may be formed of or include the same material as the upper substrate body 311. For example, the auxiliary member 315 may include the PSR. In the case where the auxiliary member 315 includes the same material as the upper substrate body 311, the auxiliary member 315 may be formed using a process to form the upper substrate body 31 or at least a portion of the upper substrate body 311. For example, the upper substrate body 311 and the auxiliary member 315 may be a single integrated body. However, the present inventive concept is not limited to this example, and in an exemplary embodiment of the present inventive concept, the auxiliary member 315 may be formed of or include at least one metallic material. The auxiliary member 315 may have various shapes. For example, the auxiliary member 315 may be shaped like a cylinder or a cuboid. For example, the auxiliary member 315 may have at least one a curved side surface. The auxiliary member 315 may be horizontally spaced apart from the connection member 5 and the lower semiconductor chip 111 an exemplary embodiment of the present inventive concept, a plurality of auxiliary members 315 may be provided. The auxiliary members 315 may be spaced apart from each other in a horizontal direction. This will be described in more detail with reference to FIG. 4.

The spacer 317 may be extended from the bottom surface 311b of the upper substrate body 311 by a predetermined length in a downward direction. For example, the spacer 317 may be a protrusion from the bottom surface 311b of the upper substrate body 311. For example, the spacer 317 may be extended from the bottom surface 311l of the upper substrate body 311 toward the lower semiconductor chip 13 in the first direction D1. For example, the spacer 317 may be disposed on the lower semiconductor chip 13. For example, the spacer 317 may be in contact with a top surface of the lower semiconductor chip 13. A thickness of the spacer 317 may be smaller than a thickness of the auxiliary member 315. The spacer 317 may be formed of or include the same material as the upper substrate body 311. For example, the spacer 317 and the upper substrate body 311 may be a single integrated body. In an exemplary embodiment of the present inventive concept, a plurality of spacers 317 may be provided. The spacers 317 may be spaced apart from each other in a horizontal direction. However, in the following description, the spacer 317 will be referred to as the singular element, for the sake of brevity.

The connection member 5 may electrically connect the lower package 1 to the upper package 3. For example, the connection member 5 may be configured to electrically connect the lower substrate 11 to the upper substrate 31. For this, the connection member 5 may be extended from the upper substrate 31 toward the lower substrate 11. For example, the Connection member 5 may be an element that is elongated in the first direction D1. The connection member 5 may be combined with the lower connection pad 113 of the lower substrate 11 and the upper connection pad 313 of the upper substrate 31. For example, the connection member 5 may be extended from the upper connection pad 313 toward the lower connection pad 113 in the first direction D1. The connection member 5 may be formed of or include at least one conductive material. For example, the connection member 5 may be formed of or include at least one metallic material (e.g., solder, copper (Cu), and aluminum (Al)). In an exemplary embodiment of the present inventive concept, the connection member 5 may be formed by combining two solder balls to each other. However, the present inventive concept is not limited to this example, and in an exemplary embodiment of the present inventive concept, the connection member 5 may be composed of a single solder ball or may be a pillar-shaped conductive element extending in a vertical direction. This will be describe (in more detail below. In an exemplary embodiment of the present inventive concept, a plurality of connection members 5 may be provided in the semiconductor package P. The connection members 5 may be spaced apart from each other in a horizontal direction. For example, the connection members 5 may be spaced apart from each other in the second direction D2 and/or the third direction D3. Some of the connection members 5 may be arranged in a predetermined direction to form a series or group of the connection members 5. This will be described in more detail with reference to FIG. 4. Hereinafter, as an example that does not limit the present inventive concept, the connection member 5 will be referred to as the singular element, for the sake of brevity.

The lower mold layer m1 may be provided on the lower substrate 11 to at least partially surround, the lower semiconductor chip 13. The lower mold layer m1 may be formed of or include an epoxy molding compound (EMC) or the like. The lower mold layer m1 may be configured to protect the lower semiconductor chip 13 from an external impact. The lower mold layer m1 may be provided to cover side and bottom surfaces of the auxiliary member 315. For example, the lower mold layer m1 may be provided to be in contact with the side and bottom surfaces of the auxiliary member 315.

The upper mold layer m2 may be provided on the upper substrate 31 to at least partially surround the upper semiconductor chip 33. The upper mold layer m2 may be formed of or include an epoxy molding compound (EMC) or the like. In an exemplary embodiment of the present inventive concept, the upper mold layer m2 may be configured to protect the upper semiconductor chip 33 from an external impact.

The outer connection ball BS may be provided on the lower substrate 1l. For example, the outer connection ball BS may be disposed on a bottom surface of the lower substrate 11. The semiconductor package P may be electrically connected to an external element through the outer connection ball BS.

Figure 2:
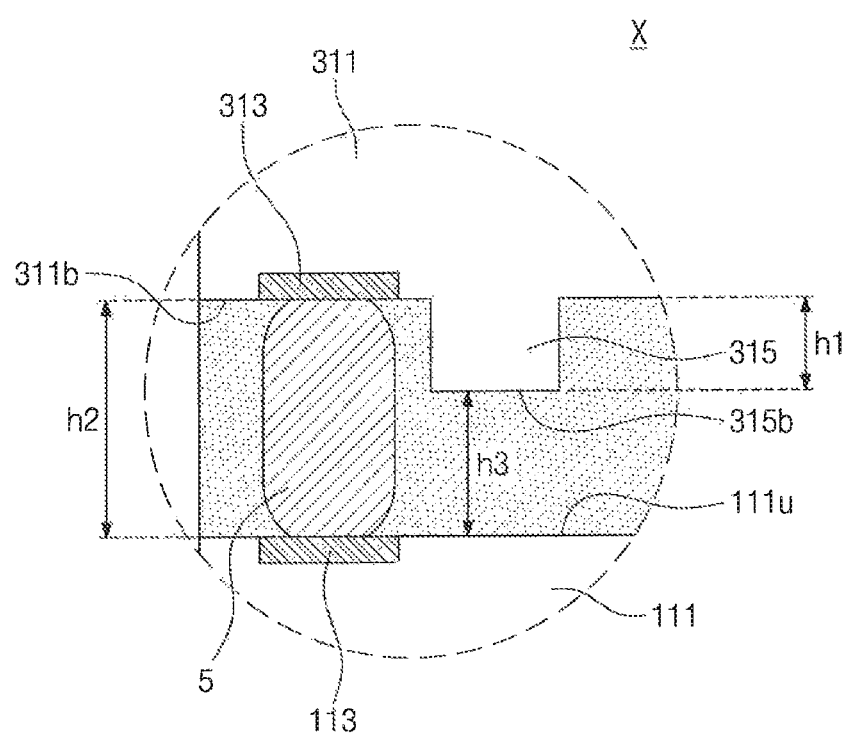
FIG. 2 is a cross-sectional view illustrating a portion X of FIG. 1.

FIG. 2 is a sectional view illustrating a portion X of FIG. 1.

Referring to FIG. 2, a thickness of the auxiliary member 315 will be referred to as a first thickness h1. The thickness of the auxiliary member 315 may be a vertical distance from the bottom surface 311b of the upper substrate body 311 to a bottom surface 315b of the auxiliary member 315 facing the lower substrate body 111. A thickness of the connection member 5 will be referred to as a second thickness 112. The thickness of the auxiliary member 315 may be smaller than the thickness of the connection member 5. For example, the first thickness h1 may be smaller than the second thickness 112. Thus, the auxiliary member 315 may be disposed on and spaced apart from a top surface 111 at of the lower substrate body 111. For example, the bottom surface 315b of the auxiliary member 315 may be spaced apart from the top surface 111u of the lower substrate body 111 by at third thickness h3 in a vertical direction. The third thickness h3 may correspond to a difference between the first thickness h1 and the second thickness 112.

Figure 3:
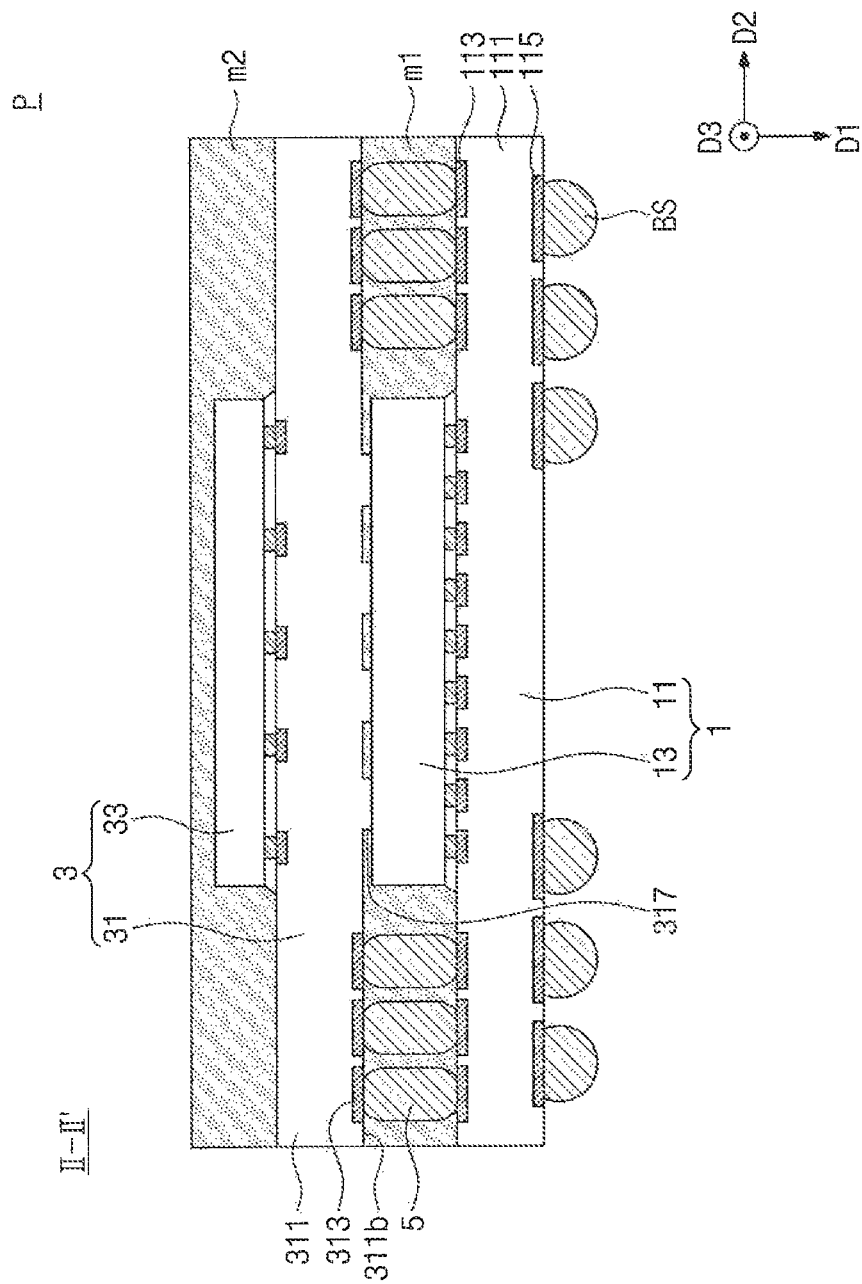
FIG. 3 is a cross-sectional view illustrating a semiconductor package according to an exemplary embodiment of the present inventive concept.

FIG. 3 is a sectional view illustrating a semiconductor package according to an exemplary embodiment of the present inventive concept.

Referring to FIG. 3, in the case where the cross-section of the semiconductor package P is taken in a direction different from that of the cross-sectional view of FIG. 1, the auxiliary member 315 (e.g., see FIG. 1) may not be seen. The number of the connection members 5 viewed in the cross-sectional view of FIG. 3 may be greater than the number of the connection members 5 viewed in the cross-sectional view of FIG. 1. This will be described in more detail with reference to a plan view of FIG. 4.

Figure 4:
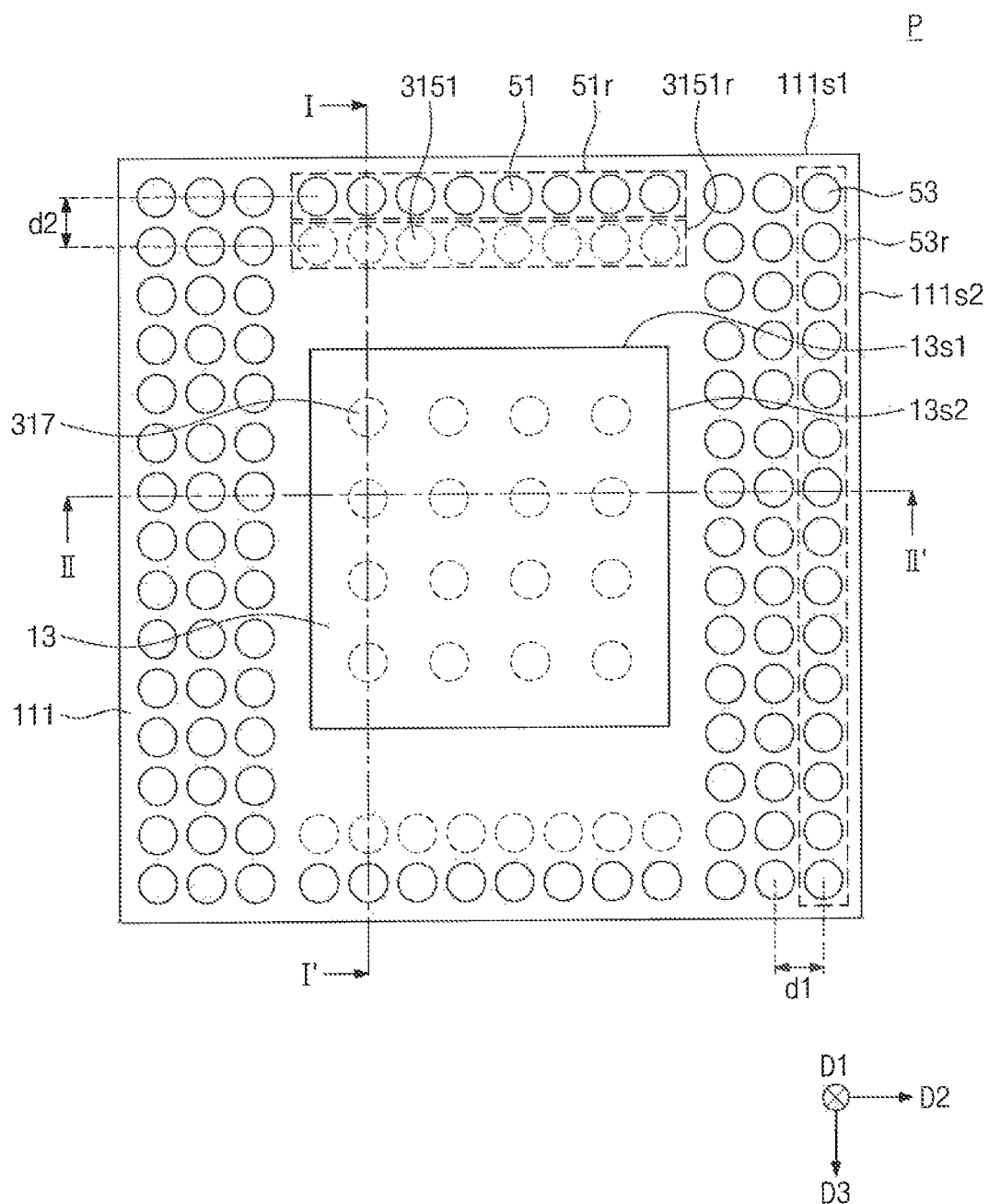
FIG. 4 is a plan view illustrating a semiconductor package according to an exemplary embodiment of the present inventive concept.

FIG. 4 is a plan view illustrating a semiconductor package according to an exemplary embodiment of the present inventive concept.

Referring to FIG. 4, the semiconductor package P may include a plurality of connection members 51 and 53. The connection members 51 and 53 may be arranged on a horizontal plane defined by two different horizontal directions. In the present specification, the horizontal plane or the horizontal directions may be substantially perpendicular to a stacking direction of the semiconductor package P. For example, in the case where the stacking direction of the semiconductor package P is parallel to the first direction D1, the horizontal directions may be the second direction D2 and/or the third direction D3 defining the horizontal plane.

In an exemplary embodiment of the present inventive concept, some (e.g., 51) of the connection members 51 and 53 may be arranged in the second direction D2. A group of the connection members 51 arranged in the second direction D2 will be referred to as a first connection member column 51r. Thus, the first connection member column 51r may be extended in the second direction D2. The first connection member column 51r may be located outside the lower semiconductor chip 13. For example, the first connection member column 51r may be positioned in an outer portion of a region that is delimited by the lower mold layer m1. For example, when viewed in a plan view, the first connection member column 51r may be positioned between a first side surface 13s1 of the lower semiconductor chip 13 and a first side surface 111s1 of the lower substrate body 111 in the first connection member column 51r, the connection members 51 may be spaced apart from each other by a predetermined distance. However, the present inventive concept is not limited to this example, and in an exemplary embodiment of the present inventive concept, the connection members 51 may be spaced apart from each other with at least two different distances in the first connection member column 51r.

In an exemplary embodiment of the present inventive concept, some (e.g., 53) of the connection members 51 and 53 may be arranged in the third direction D3. A group of the connection members 53 arranged in the third direction D will be referred to as a first connection member row 53r. Thus, the first connection member row 53r may be extended in the third direction D3. The first connection member row 53r may be located outside the lower semiconductor chip 13. For example, the first connection member row 53r may be adjacent to the lower semiconductor chip 13. For example, the first connection member row 53r may be positioned in an outer portion of a region that is delimited by be lower mold layer m1. For example, the first connection member row 53r may be positioned between a second side surface 13s2 of the lower semiconductor chip 13 and a second side surface 111s2 of the lower substrate body 111, when viewed in a plan view. The second side surface 13s2 of the lower semiconductor chip 13 may be a surface that is adjacent to the first side surface 13s1 of the lower semiconductor chip 13. The second side surface 111s2 of the lower substrate body 111 may be a surface that is adjacent to the first side surface 111s of the lower substrate body 111. In the first connection member row 53r, the connection meters 53 may be spaced apart from each other by a predetermined distance. However, the present inventive concept is not limited to this example, and in an exemplary embodiment of the present inventive concept, the connection members 53 may be spaced apart from each other with at least two different distances in the first connection member row 53r. In an exemplary embodiment of the present inventive concept, the connection members 53 may be provided to form a plurality of rows. For example, the connection members 53 may be provided to form a second connection member row and a third connection member row, near the first connection member row 53r. The connection member rows may be spaced apart from each other in the second direction D2. For example, based on a center-to-center distance, two adjacent connection member rows may be spaced apart from each other by a first distance d1 in the second direction D2.

The semiconductor package P may include a plurality of auxiliary members 3151. The auxiliary members 3151 may be arranged in the second direction D2. A group of the auxiliary members 3151 arranged in the second direction D2 will be referred to as a first auxiliary member column 3151r.

Thus, the first auxiliary member column 3151r may be extended in the second direction D2. The first auxiliary member column 3151r may be positioned outside the lower semiconductor chip 13. For example, the first auxiliary member column 3151r may be adjacent to the lower semiconductor chip 13. For example, the first auxiliary member column 3151r may be positioned in an outer portion of a region that is delimited by the lower mold layer m1. For example, the first auxiliary member column 3151r may be positioned between the first side surface 13s1 of the lower semiconductor chip 13 and the first side surface 111s1 of the lower substrate body 111, when viewed in a plan view. In the first auxiliary member column 3151r, the auxiliary members 3151 may be spaced apart from each other by a predetermined distance. However, the present inventive concept is not limited to this example, and in an exemplary embodiment of the present inventive concept, the auxiliary members 3151 in the first auxiliary member column 3151r may be spaced apart from each other with at least two different distances. For example, a first distance may be in the second direction D2 and a second distance may be in the third direction D3. The first auxiliary member column 3151r may be adjacent to the first connection member column 51r. For example, the first auxiliary member column 3151r may be adjacent to and spaced apart from the first connection member column 51r in the third direction D1. A distance, in the third direction D3, between the first auxiliary member column 3151r and the first connection member column 51r will be referred to as a second distance d2. The second distance d2 may be similar to the first distance d1. For example, the second distance d2 may be about 0.5 to about 2 times the first distance d1. For example, the second distance d2 may be substantially equal to the first distance d1. In an exemplary embodiment of the present inventive concept, a Center-to-center distance between two adjacent connection members 51 in the first connection member column 51r may be substantially equal to or similar to the first distance d1. Thus, the center-to-center distance between two adjacent connection members 51 in the first connection member column 51r may be substantially equal to similar to the second distance d2.

In an exemplary embodiment of the present inventive concept, the number of the auxiliary members 3151 in each of the first auxiliary member columns 3151r may be substantially equal to the number of the connection members 51 in the first connection member column 51r that is adjacent to the first auxiliary member column 3151r. In this case, the connection members 51, which respectively correspond with the auxiliary members 3151 constituting each of the first auxiliary member columns 3151r, may be provided in the first connection member column 51r adjacent to the first auxiliary member column 3151r. In addition, when the number of the auxiliary members 3151 in the first auxiliary member column 3151r is equal to the number of the connection members 51 in the first connection member column 51r adjacent to the first auxiliary member column 3151r, the auxiliary members 3151 and the connection members 51 may be disposed in a staggered manner or an alternating arrangement. However, the present inventive concept is not limited to this example, and in an exemplary embodiment of the present inventive concept, the number of the auxiliary members 3151 in each of the first auxiliary member columns 3151r may be different from the number of the connection members 51 in the first connection member column 51r adjacent to the first auxiliary member column 3151r.

Figure 5:
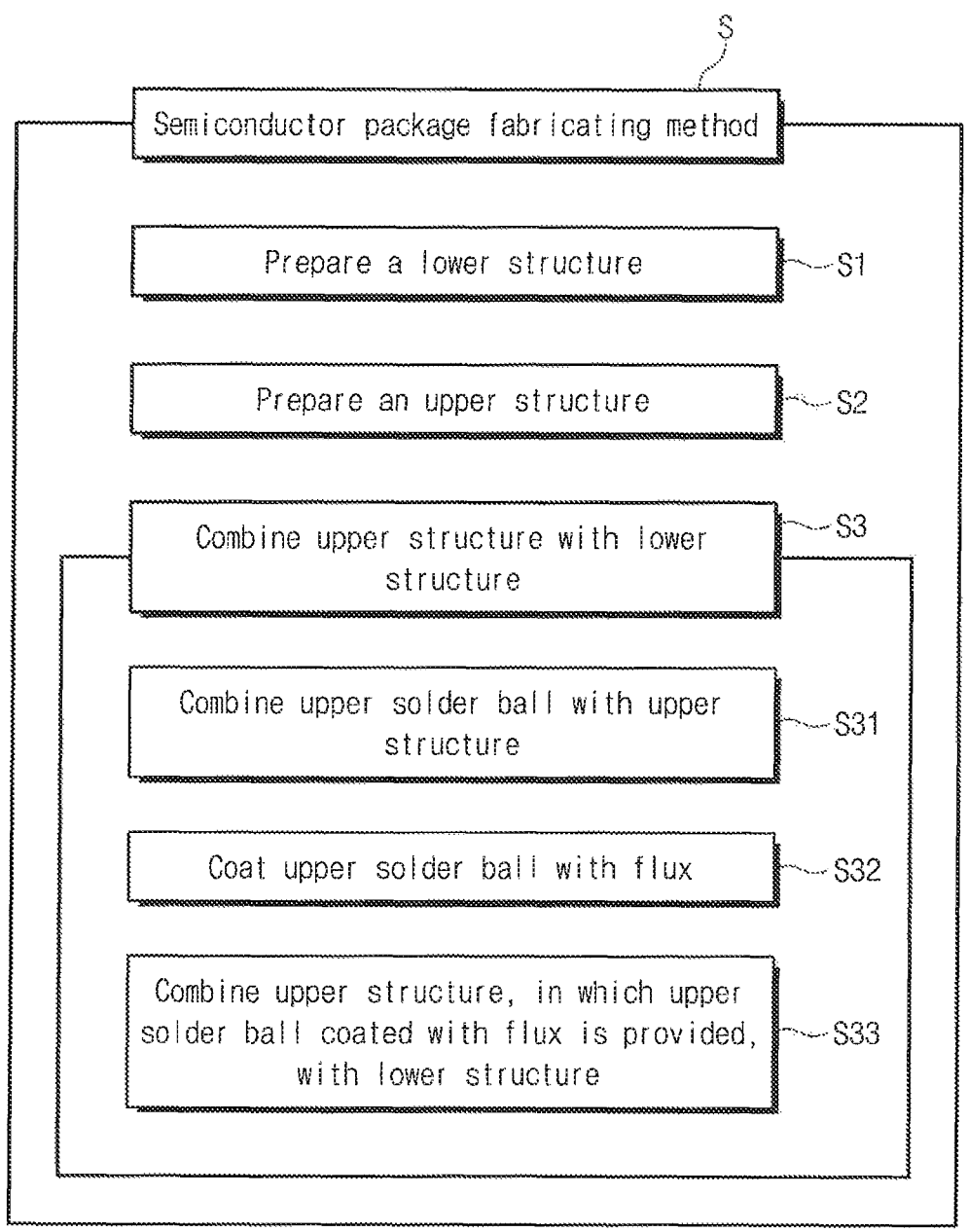
FIG. 5 is a flow chart illustrating a method of fabricating a semiconductor package, according to an exemplary embodiment of the present inventive concept.

FIG. 5 is a flow chart illustrating a method of fabricating a semiconductor package, according to an exemplary embodiment of the present inventive concept.

Referring to FIG. 5, a fabrication method S to be described below may be used to fabricate the semiconductor package P described with reference to FIGS. 1 to 4.

The fabrication method S may include preparing a lower structure (in S1), preparing an upper structure (in S2), and combining the upper structure with the lower structure (in S3).

The combining of the upper structure with the lower structure (in S3) may include combining an upper solder ball with the upper structure (in S31). The combining of the upper structure with the lower structure (in S3) may further include coating the upper solder ball with a flux (in S32), and combining the upper structure, in which the upper solder ball coated with the flux is provided, with the lower structure (in S33).

Hereinafter, each step of the fabrication method S will be described in more detail with reference to FIGS. 6 to 19.

FIGS. 6 to 19 are cross-sectional views sequentially illustrating a process of fabricating a semiconductor package using the method of FIG. 5.

Figure 6:
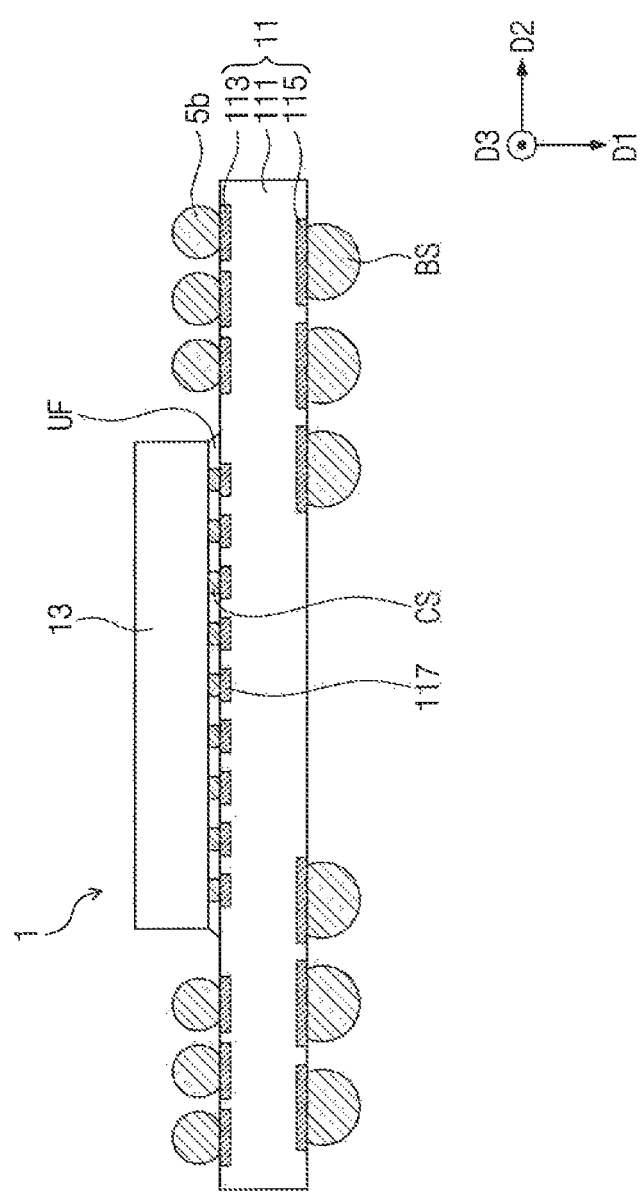
Figure 7:
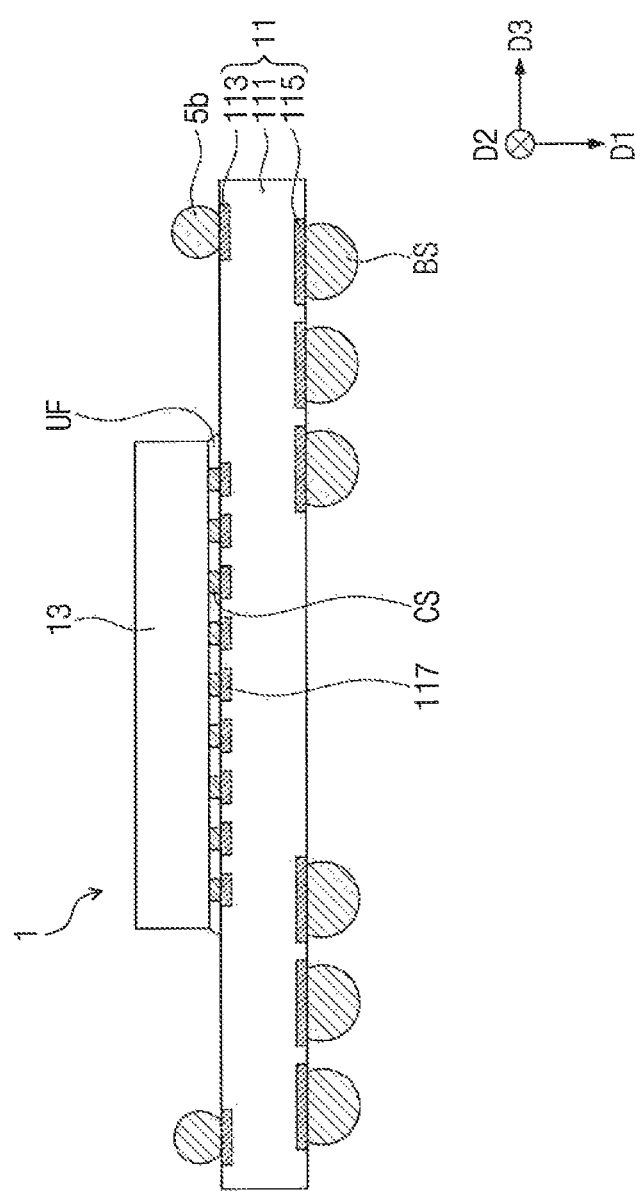

Referring to FIGS. 6 and 7 in conjunction with the method of FIG. 5, the preparing of the lower structure (in S1) may include preparing the lower package 1. For example, the lower structure may be the lower package 1. However, the present inventive concept is not limited to this example, and in an exemplary embodiment of the present inventive concept, the lower structure may be another electronic component that is combined with the upper structure. Hereinafter, the description that follows will be referred to as an example in which the lower structure is the lower package 1, however, the present inventive concept not limited thereto, in the lower package 1, a lower pad 117 of the lower substrate 11 and the lower semiconductor chip 13 may be electrically connected to each other through a connection ball CS. A space between the lower substrate 11 and the lower semiconductor chip 13 may be filled with art under fill layer UF. A lower solder ball 5b may be disposed on and combined with the lower substrate 11. The lower solder ball 5b may be disposed on and combined with the lower connection pad 113 disposed on the lower substrate 11. The lower solder ball 5b may be spaced apart from the lower semiconductor chip 13.

Figure 10:
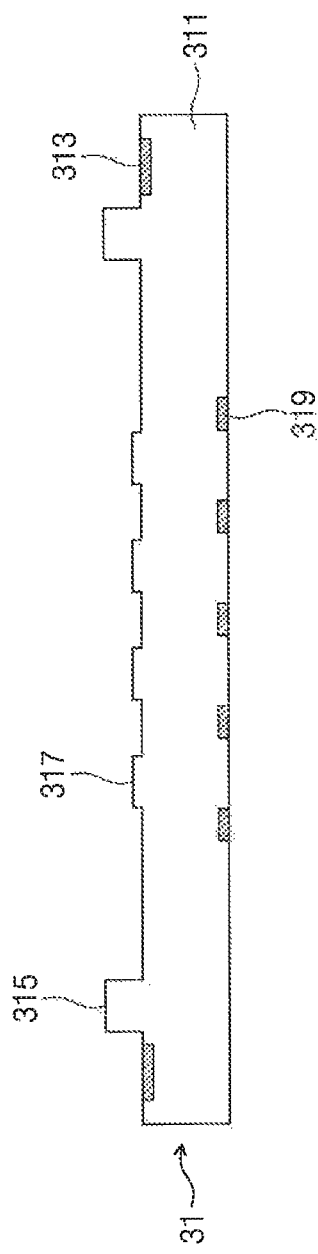

Referring to FIGS. 8 to 10 in conjunction with FIG. 5, the preparing of the upper structure (in S2) may include preparing the upper package 3. For example, the upper structure may be the upper package 3. However, the present inventive concept is not limited to this example, and in an exemplary embodiment of the present inventive concept, the upper structure may be another electronic component that is combined with the lower structure. Hereinafter, the description that follows will be referred to as an example in which the upper structure is the upper package 3; however, the present inventive concept is not limited thereto.

Referring to FIG. 8, the upper connection pad 313 may be exposed on a bottom surface of the upper substrate body 311. For example, in the case where the upper substrate body 311 includes a redistribution layer substrate, the upper substrate body 311 may be formed by a coating process, an exposing process, a developing process, and/or a curing process. The upper substrate body 311 may be formed of or include PSR or the like. A conductive material may be provided in the upper substrate body 311. For example, a redistribution structure, which is formed of a conductive material, may be provided in the upper substrate body 311. For example, the redistribution structure may be formed by an electroplating process or the like. The redistribution structure may be configured to electrically connect a lower pad 319 and the upper connection pad 313 to each other.

Referring to FIG. 9, the spacer 317 and a preliminary auxiliary member 315' may be formed on the bottom surface of the upper substrate body 311. The spacer 31 and the preliminary auxiliary member 315' may be formed of or include substantially the same material as the upper substrate body 311. The spacer 317 and the preliminary auxiliary member 315' may be formed by performing, for example, a coating process, an exposing process, a developing process, and/or a curing process on the bottom surface of the upper substrate body 311. However, the present inventive concept is not limited thereto. For example, the spacer 317 and the preliminary auxiliary member 315' may include a material different from that of the upper substrate body 311.

Referring to FIG. 10, the auxiliary member 315 may be formed by further performing a coating process, an exposing process, a developing process, and/or a curing process on the preliminary auxiliary member 315'. The thickness of the auxiliary member 315 may be larger than the thickness of the spacer 317.

Figure 11:
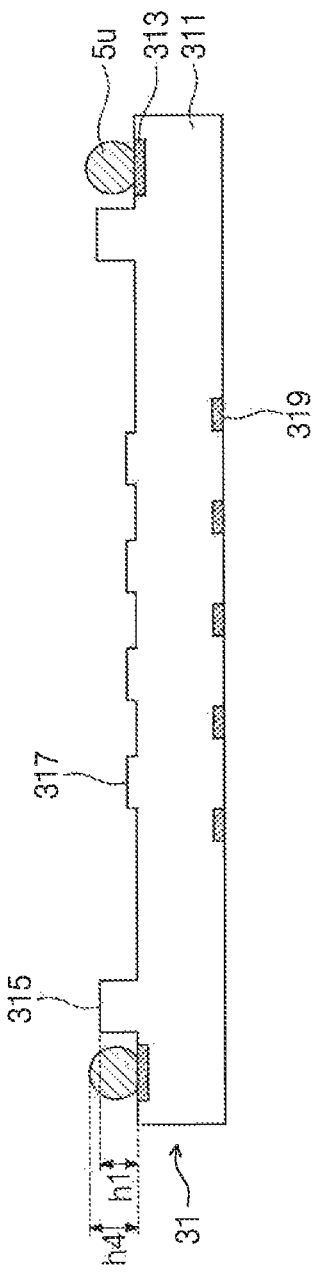

Referring to FIGS. 11 and 5, the combining of the upper solder ball with the upper structure (in 531) may include combining an upper solder ball 5u with the upper connection pad 313. A thickness of the upper solder ball 5u will be referred to as a fourth thickness h4. In an exemplary embodiment of the present inventive concept, the thickness of the auxiliary member 315 may be smaller than the thickness of the upper solder ball 5u. For example, the first thickness h1 may be smaller than the fourth thickness h4.

Referring to FIGS. 12 to 17 in conjunction with FIG. 5, the coating of the upper solder ball with the flux (in S32) may include coating the exposed surface of the upper solder ball 5u with a flux F. For example, the entire exposed surface of the upper solder ball 5u may be coated with the flux F.

Figure 12:
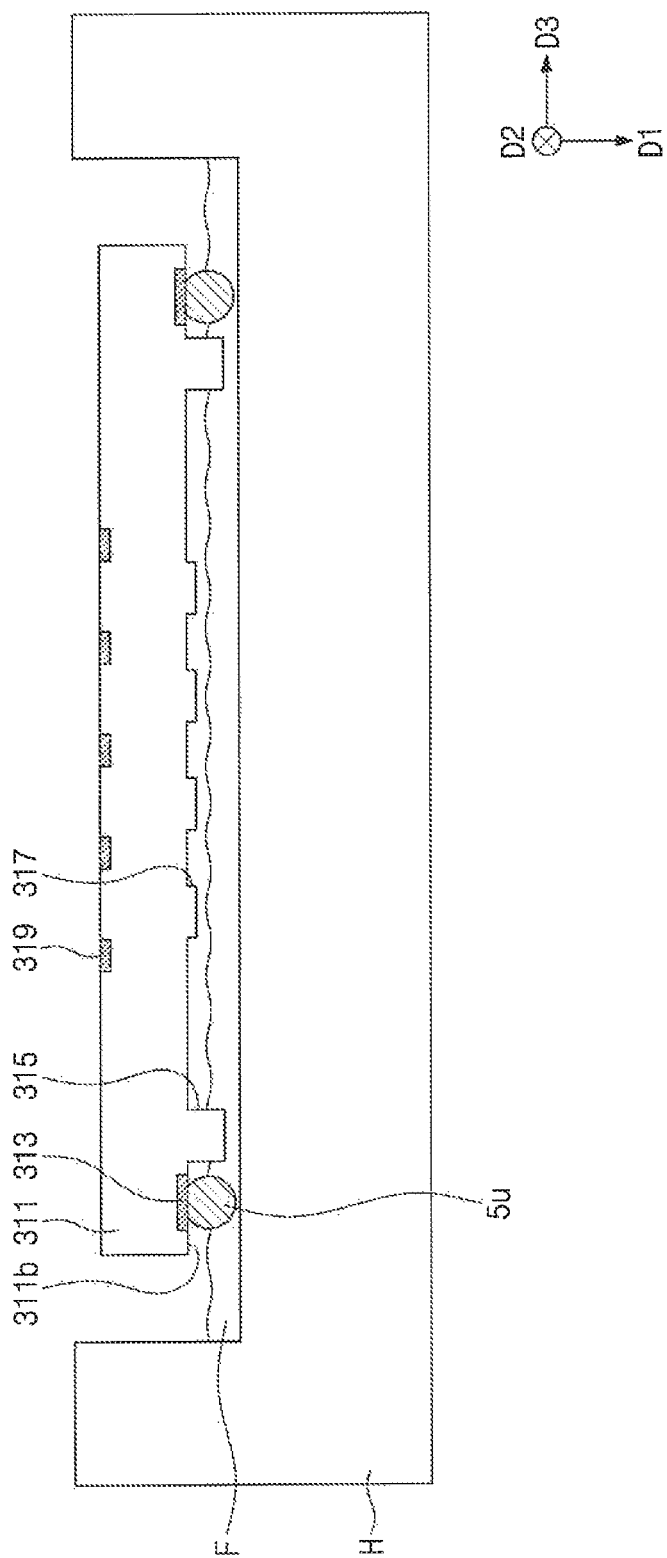
Figure 13:
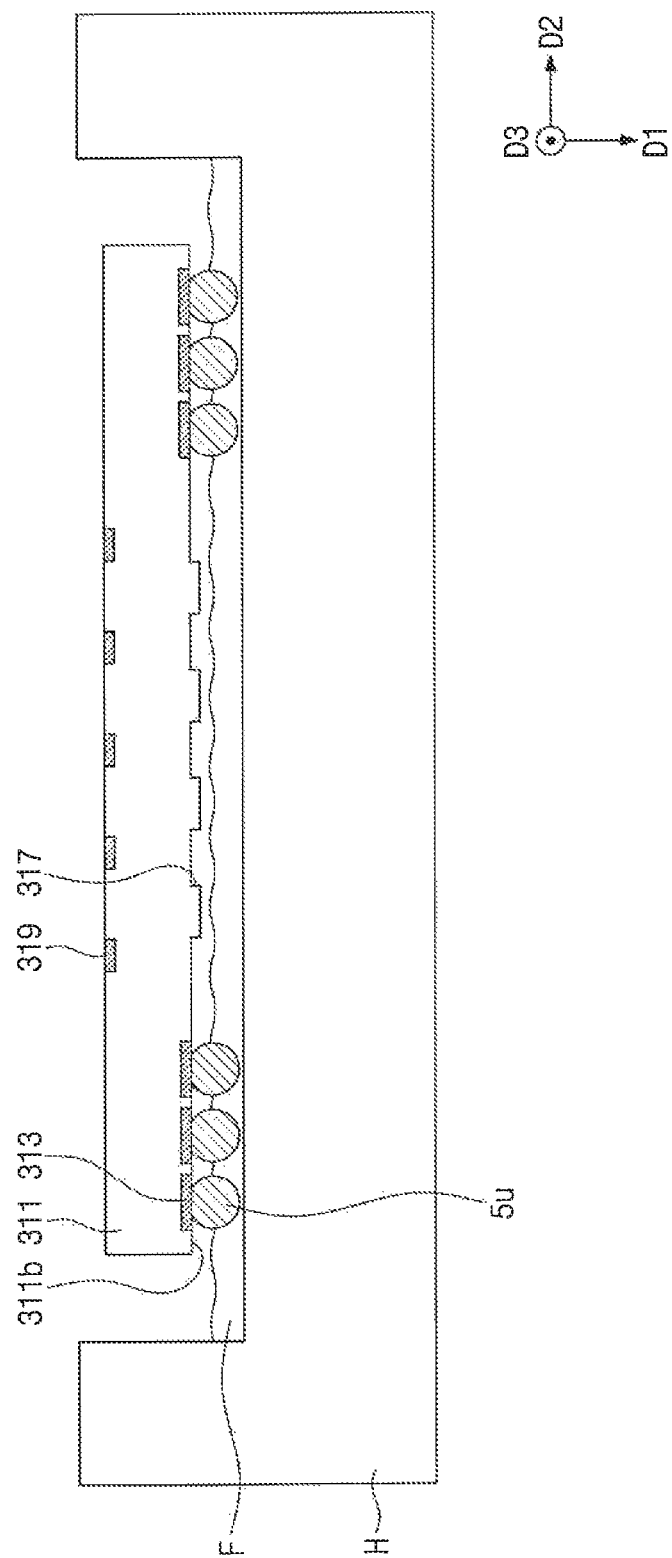

Referring to FIGS. 12 and 13, the coating of the flux may be performed using a dipping process. For example, the upper substrate may be moved toward a flux container H containing the flux F to coat the upper solder ball 5u with the flux F. For example, the upper substrate may be moved toward the flux container H containing the flux F such that the bottom surface and at least a portion of the side surface of the auxiliary member 315 are immersed in the flux F. The exposed surface of the upper solder ball 5u may be partially or fully dipped into the flux F.

In a semiconductor package and its fabrication method according to an exemplary embodiment of the present inventive concept, it may be possible to prevent a region of the substrate, on which the solder ball is not formed, from drooping due to the force of gravity during the dipping process. For example, since the auxiliary member is located in the region, on which the solder ball is not formed, it may be possible to prevent the substrate from drooping further downward into the flux F. Accordingly, it may be possible to prevent a warpage issue in the substrate. Furthermore, since a portion of the substrate is prevented from drooping, it may be possible to uniformly coat all of the solder balls with the flux.

Figure 14:
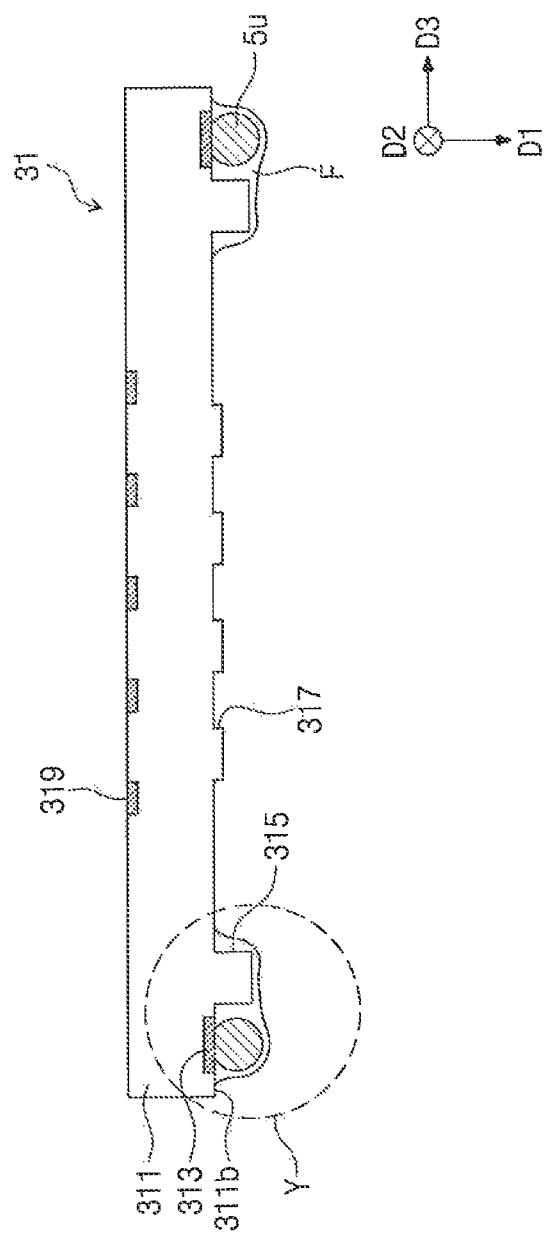
Figure 15:
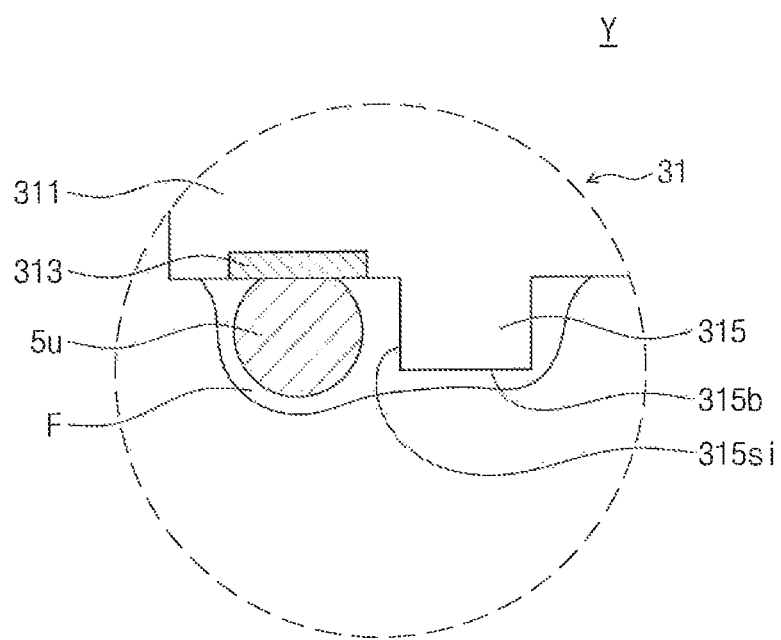

Referring to FIGS. 14 and 15, the flux F may be coated around the upper solder ball 5u and the auxiliary member 315. For example, the flux F may be formed to cover or fill a side surface of the upper solder ball 5u, a space between the upper solder ball 5u and the auxiliary member 315, and the bottom surface 315b of the auxiliary member 315. For example, in the dipping process described with reference to FIG. 12, the flux F may infiltrate a region between the upper solder ball 5*u* and the auxiliary member 315 by the surface tension. Thus, the flux F may be disposed between the upper solder ball 5*u* and an inner side surface 3151*si* of the auxiliary member 315. Due to the auxiliary member 315 adjacent to the upper solder ball 5*u*, the flux F may cover the exposed surface of the upper solder ball 5*u*, even when any other solder ball is not provided near the upper solder ball 5*u*, For example, the flux F may cover the entire exposed surface of the upper solder ball 5*u*. Thus, it may be possible to uniformly coat the upper solder ball 5*u* with the flux F.

Figure 16:
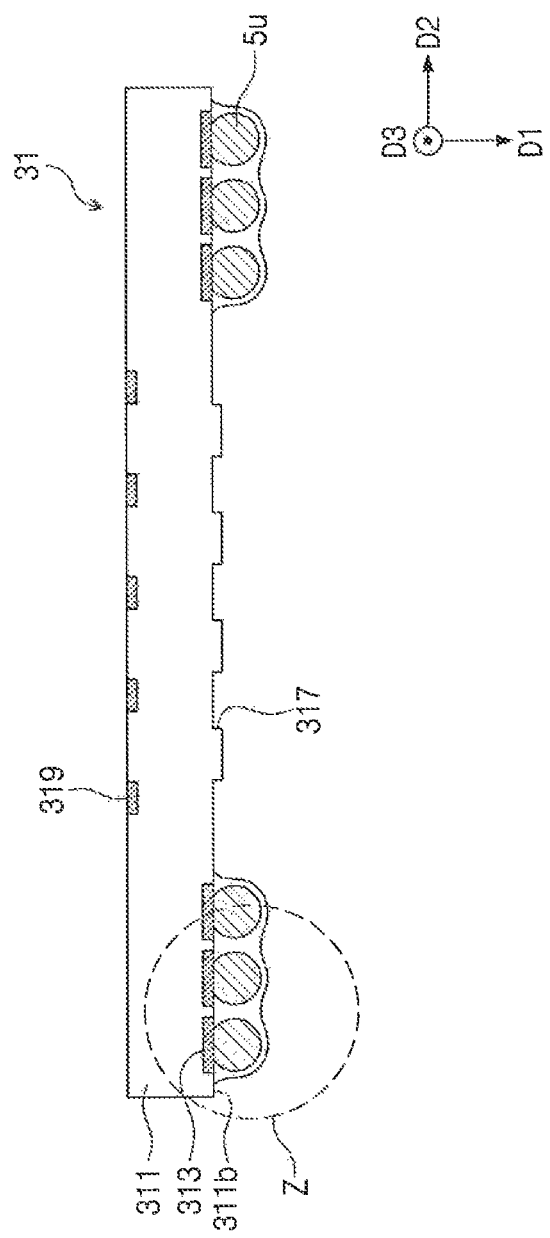
Figure 17:
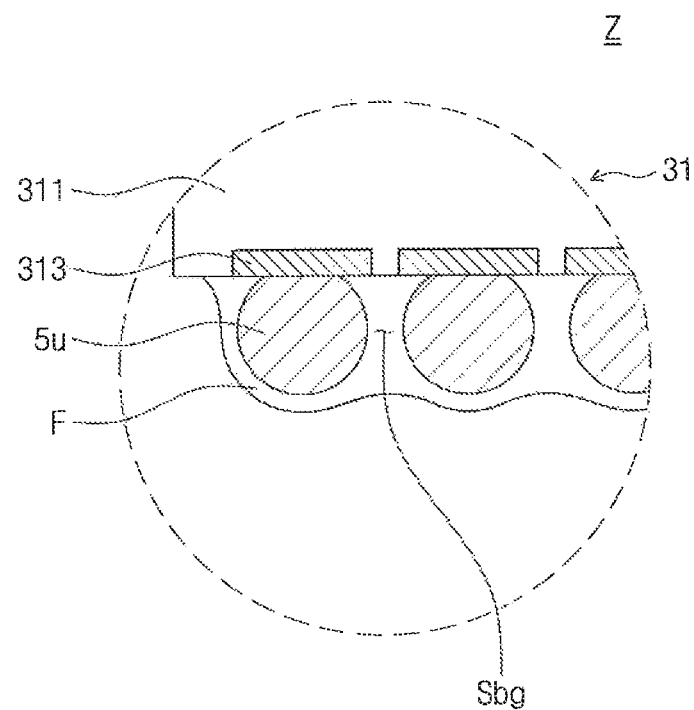

Referring to FIGS. 16 and 17, in the case where the upper solder balls 5*u* are arranged to be adjacent to each other, the flux F may be uniformly coated onto the upper solder balls 5*u*, even when there is no auxiliary member. For example, the flux F may be infiltrated into a space Sbg between adjacent upper solder balls 5*u* to coat the entire exposed surface of the upper solder balls 5*u*.

In a semiconductor package and its fabrication method according to an exemplary embodiment of the present inventive concept, it may be possible to uniformly coat the solder ball with the flux. For example, the auxiliary member may be disposed adjacent to an isolated solder ball, around which there is no other solder ball, and in this case, the isolated solder ball may be uniformly coated with the flux. The flux may remove an oxide layer or the like, which is formed on the surface of the solder ball. In the case where the oxide layer or the like is removed from the surface of the solder ball by the flux, it may be possible to increase reliability in electrical connection between the solder ball and another element. Since the solder ball is uniformly coated with the flux, it may be possible to prevent a non-wet issue, which may occur when a solder ball is not coated with the flux, from occurring. For example, it may be possible to prevent the non-wet issue from occurring in the isolated solder ball. Accordingly, it may be possible to prevent a broken-wire issue from occurring in the solder ball. This may allow for an increase in yield of the semiconductor package.

In a semiconductor package and its fabrication method according to an exemplary embodiment of the present inventive concept, the auxiliary member may be formed to have a circular shape, a cylindrical shape or a cuboid shape. For example, the auxiliary member may have a curved side surface. Accordingly, the surface tension in the flux coating process may be maximized. Thus, it may be possible to more effectively increase uniformity in the flux coating process.

In a semiconductor package and its fabrication method according to an exemplary embodiment of the present inventive concept, the auxiliary member may be formed of the same material as the substrate body. Thus, the auxiliary member may be successively formed using a process of forming a substrate. Accordingly, the auxiliary member may be formed in a simplified and cost-effective manner.

Figure 18:
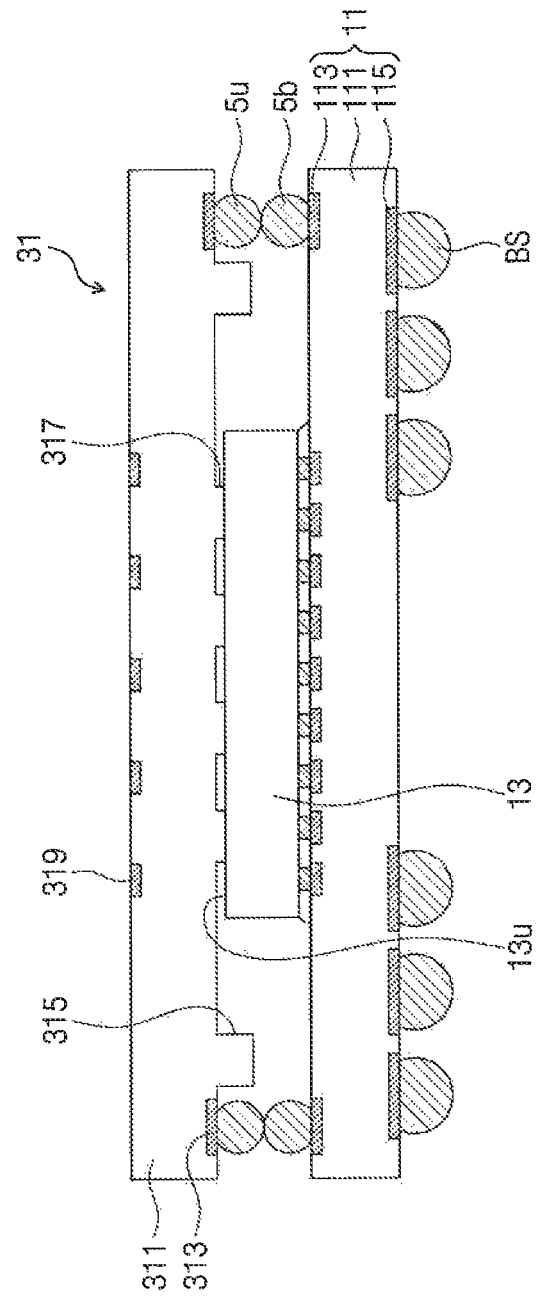

Referring to FIGS. 18 and 5, the combining of the upper structure, in which the upper solder ball 5*u* coated with the flux is provided, with the lower structure (in 533) may include disposing the upper substrate 31 on the lower package such that the upper solder ball 5*u* is in contact with the lower solder ball 5*b*. The flux (e.g., see FIGS. 14 to 17) may be formed to uniformly cover a surface of the upper solder ball 5*u*. In addition, a surface of the auxiliary member 315 may also be coated with the flux. In an exemplary embodiment of the present inventive concept, the flux may be formed to cover a surface of the lower solder ball 5*b*, in addition to the surface of the upper solder ball 5*u* and/or the surface of the auxiliary member 315. The flux may remove an oxide layer that is formed on the surface of the lower solder ball 5*b*.

Figure 19:
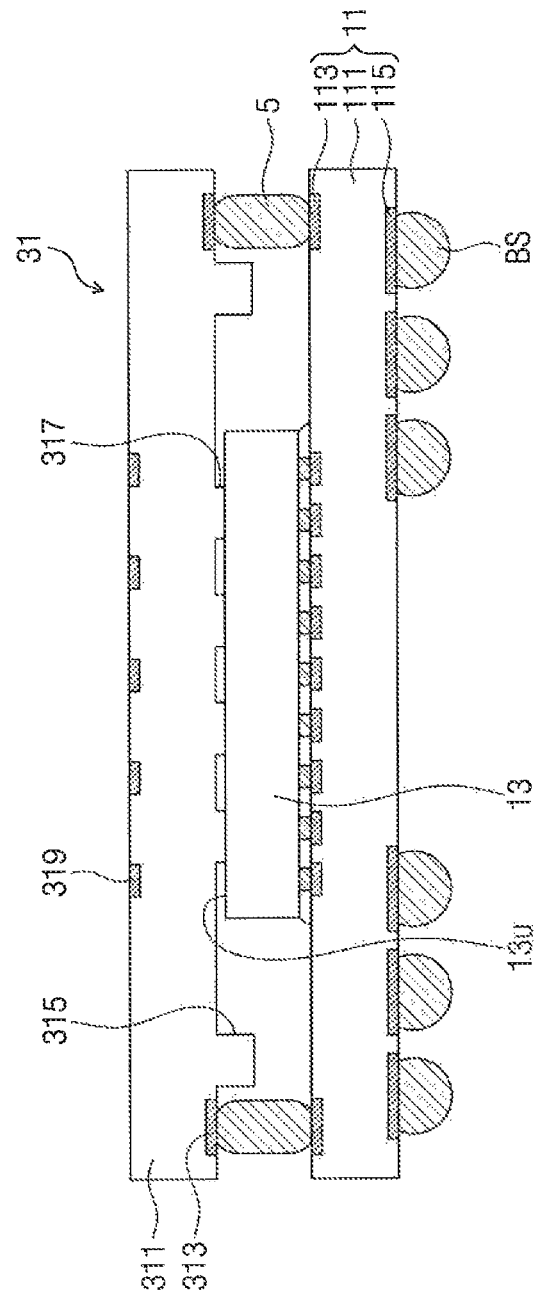

Referring to FIG. 19, the upper solder ball 5*u* may be combined with the lower solder ball 5*b*. For example, the upper and lower solder balls 5*u* and 5*b* may be bonded and combined to each other by, for example, a reflow process. However, the present inventive concept is not limited to this example, and in an exemplary embodiment of the present inventive concept, the upper and lower solder balls 5*u* and 5*b* may be bonded to each other by another process, such as a thermo-compression bonding process. The flux, which is formed on the surfaces of the upper solder ball 5*u*, the auxiliary member 315, and/or the lower solder ball 5*b*, may be partially or wholly removed during the process of bonding the upper and lower solder balls 5*u* and 5*b*. Each of the connection members 5 may be composed of the upper and lower solder balls 5*u* and 5*b* that are bonded to each other and are paired.

In a semiconductor package and its fabrication method according to an exemplary embodiment of the present inventive concept, the auxiliary member may be used to effectively coat the surface of the solder ball with the flux. Accordingly, there is no need to perform the dipping process in an excessive manner, to coat the entire surface of the solder ball with the flux. For example, even, when the solder ball is slightly immersed in the flux container, the surface of the solder ball may be sufficiently coated with the flux. Accordingly, it may be possible to prevent some of the solder balls from being excessively coated with the flux. Since all of the solder balls are coated with an appropriate amount of flux, it may be possible to effectively remove the flux in the bonding process of combining the solder ball to another element. For example, in the reflow process, it may be possible to uniformly remove the flux from all of the solder balls. Accordingly, there is no need to perform an additional cleaning process to remove a residual flux. Thus, it may be possible to simplify the overall fabrication process.

Figure 20:
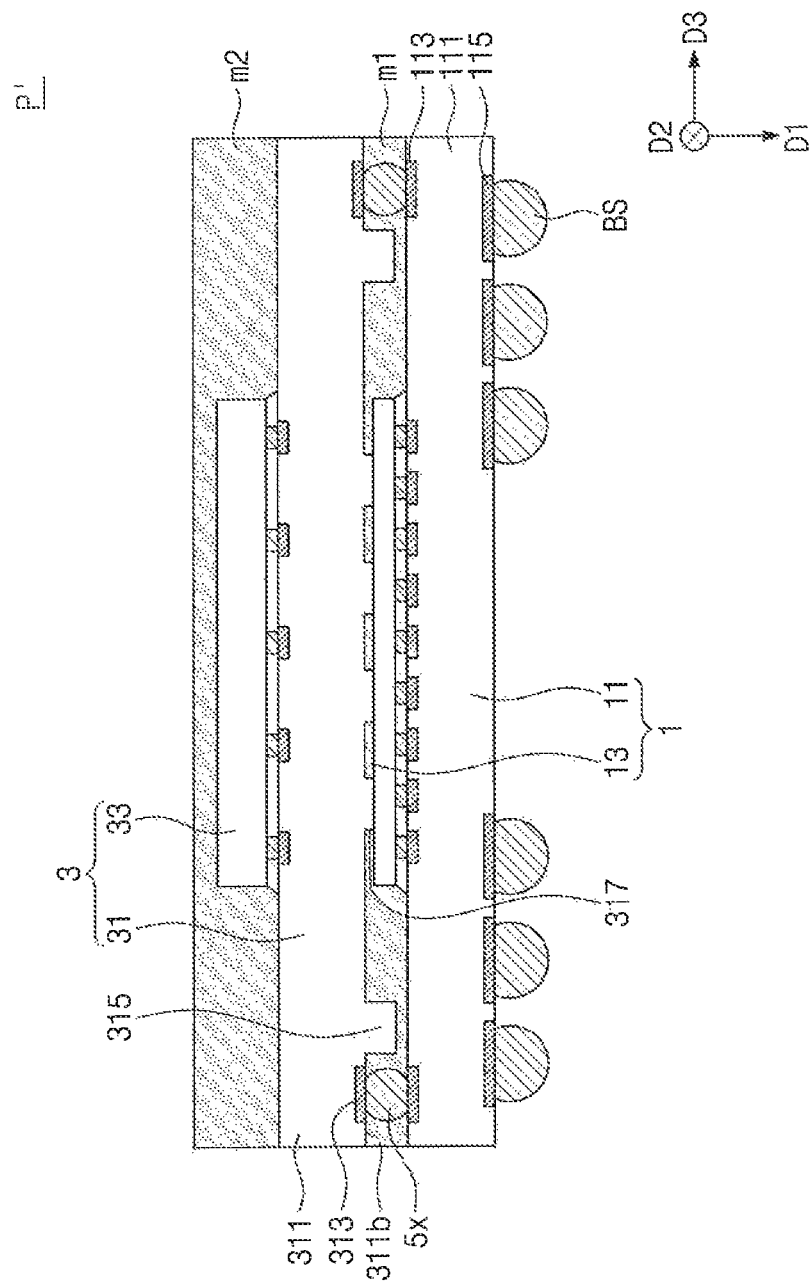
FIG. 20 is a sectional view illustrating a semiconductor package according to an exemplary embodiment of the present inventive concept.

FIG. 20 is a cross-sectional view illustrating a semiconductor package according to an exemplary embodiment of the present inventive concept.

In the following description, the structural or method features, which are the same as or similar to those described with reference to FIGS. 1 to 19, may be omitted, for the sake of brevity.

Referring to FIG. 20, in a semiconductor package P', the connection member 5*x* may be formed to have a shape of a single ball, unlike the structure of FIG. 1. For example, the connection member 5*x* may be formed by just one ball, and not by a jointed structure of two balls. In addition, the connection member may be provided in the form of a pillar or the like, but not a ball.

Figure 21:
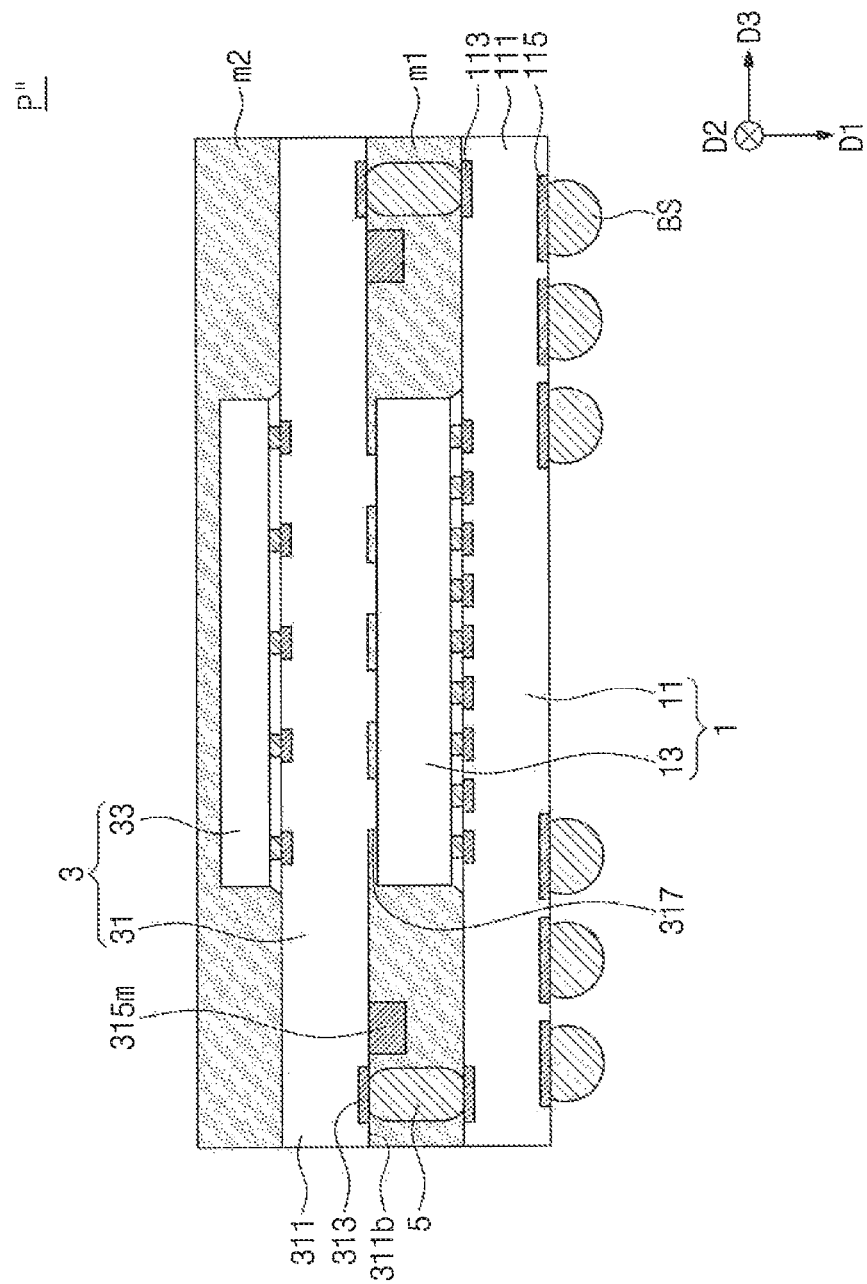
FIG. 21 is a cross-sectional view illustrating a semiconductor package according to an exemplary embodiment of the present inventive concept.

FIG. 21 is a cross-sectional view illustrating a semiconductor package according to an exemplary embodiment of the present inventive concept.

In the following description, the structural or method features, which are the same as or similar to those described with reference to FIGS. 1 to 20, may be omitted, for the sake of brevity.

Referring to FIG. 21, in a semiconductor package P'', the auxiliary member 315*m* may be formed of or include a material different from that of the upper substrate body 311, unlike the structure of FIG. 1. In the case where the auxiliary member 315*m* includes a material different from that of the upper substrate body 311, the auxiliary member 315*m* and the upper substrate body 311 may not be formed in a successive manner. In an exemplary embodiment of the present inventive concept, the auxiliary member 315*m* may be formed of or include at least one metallic material. However, the present inventive concept is not limited to this example.

In a semiconductor package and a method of fabricating the same according to an exemplary embodiment of the present inventive concept, it may be possible to prevent a non-wet issue from occurring.

In a semiconductor package and a method of fabricating the same according to an exemplary embodiment of the present inventive concept, it may be possible to increase a production yield of the semiconductor package.

In a semiconductor package and a method of fabricating the same according to an exemplary embodiment of the present inventive concept, it may be possible to realize a uniform flux coating and to simplify a structure of the semiconductor package.

While the present inventive concept has been particularly shown and described with reference to exemplary embodiments thereof, it will be apparent to those of ordinary skill in the art that various changes in form and detail may be made thereto without departing from the spirit and scope of the present inventive concept.

What is claimed is:

1. A semiconductor package, comprising:
a lower package;
an upper substrate on the lower package; and
a plurality of connection members electrically connecting the lower package to the upper substrate,
wherein the lower package comprises:
 a lower substrate; and
 a lower semiconductor chip on the lower substrate,
wherein the upper substrate comprises;
 an upper substrate body;
 upper connection pads provided on the upper substrate body and combined with the plurality of connection members, respectively; and
 auxiliary members extending from a bottom surface of the upper substrate body toward the lower substrate, wherein the auxiliary members comprise the same insulating material as the upper substrate body,
wherein the plurality of connection members are arranged in a first horizontal direction to form a first connection member column,
wherein the auxiliary members are arranged in the first horizontal direction to form a first auxiliary member column,
wherein the first connection member column and the first auxiliary member column are located between a side surface of the lower semiconductor chip and a side surface of the lower substrate,
the first auxiliary member column is spaced apart from the first connection member column, in a second horizontal direction crossing the first horizontal direction,
wherein, the semiconductor package further comprises a lower mold layer provided on the lower substrate, wherein a side surface of the auxiliary member contacts the lower mold layer.

2. The semiconductor package of claim 1, wherein each of the auxiliary members is spaced apart from a top surface of the lower substrate.

3. The semiconductor package of claim 1, wherein each of the auxiliary members comprises a photo solder resist (PSR).

4. The semiconductor package of claim 1, wherein each of the auxiliary members has a circular shape.

5. The semiconductor package of claim 1, wherein the lower mold layer at least partially surrounds a side surface of the lower semiconductor chip,
wherein the lower mold layer overlaps a bottom surface of each of the auxiliary members and at least partially surrounds each of the auxiliary members.

6. The semiconductor package of claim 1, wherein two adjacent connection members of the plurality of connection members in the first connection member column are spaced apart from each other by a first distance,
wherein the first connection member column and the first auxiliary member column are spaced apart from each other by a second distance, and
the second distance is about 0.5 to about 2 times the first distance.

7. The semiconductor package of claim 1, wherein the number of the auxiliary members in the first auxiliary member column is equal to the number of the connection members in the first connection member column, and
each of the auxiliary members in the first auxiliary member column is spaced apart from a corresponding connection member of the plurality of connection members in the first connection member column in the second horizontal direction.

8. The semiconductor package of claim 1, further comprises a spacer extending from the bottom surface of the upper substrate body toward the lower semiconductor chip.

9. The semiconductor package of claim 8, wherein a thickness of each of the auxiliary members is larger than a thickness of the spacer.

10. A semiconductor package, comprising:
a lower package;
an upper package on the lower package; and
a plurality of connection members electrically connecting the lower package to the upper package,
wherein the lower package comprises:
 a lower substrate; and
 a lower semiconductor chip on the lower substrate,
wherein the upper package comprises:
 an upper substrate; and
 an upper semiconductor chip on the upper substrate,
wherein the upper substrate comprises:
 an upper substrate body;
 upper connection pads exposed by a bottom surface of the upper substrate body and are respectively combined with the plurality of connection members; and
 auxiliary members extending from the bottom surface of the upper substrate body in a first direction,
wherein the lower substrate comprises:
 a lower substrate body; and
 lower connection pads exposed by a top surface of the lower substrate body and are respectively combined with the plurality of connection members,
wherein the plurality of connection members are arranged to form:
 a first connection member column parallel to a second direction crossing the first direction;
 a first connection member row parallel to a third direction crossing the first direction and the second direction; and
 a second connection member row parallel to the third direction,
wherein the first connection member row and the second connection member row are spaced apart from each other in the second direction, wherein the auxiliary members are arranged in the second direction to form a first auxiliary member column spaced apart from the lower semiconductor chip in the third direction, and wherein the first auxiliary member column is spaced apart from the first connection member column in the third direction.

11. The semiconductor package of claim 10, wherein the first connection member row and the second connection member row are spaced apart from each other by a first distance in the second direction, the first connection member column and the first auxiliary member column are spaced apart from each other by a second distance in the third direction, and the second distance is about 0.5 to about 2 times the first distance.

12. The semiconductor package of claim 10, further comprising a lower mold layer provided on the lower substrate and at least partially surrounding a side surface of the lower semiconductor chip, and wherein the lower mold layer is in contact with a bottom surface of each of the auxiliary members and a side surface of each of the auxiliary members and at least partially surrounds each of the auxiliary members.

13. The semiconductor package of claim 10, wherein each of the auxiliary members has a cylindrical shape or a cuboid shape.

14. The semiconductor package of claim 10, wherein each of the auxiliary members comprises a photo solder resist (PSR) or a metal.

15. A method of fabricating a semiconductor package, comprising:

preparing a lower structure;
preparing an upper structure; and
combining the upper structure to the lower structure,
wherein the upper structure comprises a substrate,
wherein the substrate comprises:
a substrate body;
a connection pad on a bottom surface of the substrate body; and
an auxiliary member extending from the bottom surface of the substrate body,
wherein the combining of the upper structure to the lower structure comprises:
combining an upper solder ball to the connection pad on the bottom surface of the substrate body;
coating the upper solder ball with a flux; and
combining the upper structure, on which the upper solder ball coated with the flux is provided, with the lower structure, after coating the upper solder ball with the flux,
wherein the upper solder ball and the auxiliary member are spaced apart from each other, and
wherein the coating of the upper solder ball with the flux comprises forming the flux in a region between the upper solder ball and the auxiliary member.

16. The method of claim 15, wherein the coating of the upper solder ball with the flux comprises forming the flux to cover a bottom surface of the auxiliary member and a side surface of the auxiliary member.

17. The method of claim 15, wherein the coating of the upper solder ball with the flux is performed in a dipping manner.

18. The method of claim 17, wherein the coating of the upper solder ball with the flux comprises moving the upper structure toward a flux container containing the flux such that a bottom surface of the auxiliary member is immersed into the flux in the flux container.

19. The method of claim 15, wherein a thickness of the auxiliary member is less than a thickness of the upper solder ball.

20. The method of claim 15, wherein the auxiliary member comprises a Photo solder resist (PSR) or a metal.

* * * * *